(12) United States Patent
Verma et al.

(10) Patent No.: US 9,064,078 B2
(45) Date of Patent: Jun. 23, 2015

(54) METHODS AND SYSTEMS FOR DESIGNING AND MANUFACTURING OPTICAL LITHOGRAPHY MASKS

(71) Applicant: GLOBALFOUNDRIES, Inc., Grand Cayman (KY)

(72) Inventors: Piyush Verma, Sunnyvale, CA (US); Todd P. Lukanc, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 3 days.

(21) Appl. No.: 13/953,875

(22) Filed: Jul. 30, 2013

(65) Prior Publication Data

US 2015/0040078 A1    Feb. 5, 2015

(51) Int. Cl.
    *G06F 17/50*    (2006.01)

(52) U.S. Cl.
    CPC ........ *G06F 17/5072* (2013.01); *G06F 17/5081* (2013.01)

(58) Field of Classification Search
    CPC ........ G06F 1/36; G06F 1/144; G06F 17/5081
    USPC .............. 716/100, 50–55; 430/5, 30
    See application file for complete search history.

(56) References Cited

U.S. PATENT DOCUMENTS

| | | | |
|---|---|---|---|
| 7,240,305 B2 * | 7/2007 | Lippincott | 716/52 |
| 7,275,227 B1 * | 9/2007 | Ying | 716/52 |
| 8,102,408 B2 * | 1/2012 | Verma et al. | 346/87 |
| 8,327,299 B1 * | 12/2012 | Gennari et al. | 716/52 |
| 8,365,103 B1 * | 1/2013 | Gennari et al. | 716/52 |
| 2005/0251771 A1 * | 11/2005 | Robles | 716/5 |
| 2005/0273733 A1 * | 12/2005 | Lippincott | 716/4 |
| 2006/0161452 A1 * | 7/2006 | Hess | 705/1 |
| 2006/0228041 A1 * | 10/2006 | Joshi | 382/260 |
| 2006/0236294 A1 * | 10/2006 | Saidin et al. | 716/19 |
| 2008/0072207 A1 * | 3/2008 | Verma et al. | 716/21 |
| 2009/0144692 A1 * | 6/2009 | Cain et al. | 716/19 |
| 2009/0281778 A1 * | 11/2009 | Belledent | 703/6 |
| 2012/0202351 A1 * | 8/2012 | Cha et al. | 438/758 |
| 2013/0198700 A1 * | 8/2013 | Sakajiri | 716/53 |

* cited by examiner

*Primary Examiner* — Suchin Parihar
(74) *Attorney, Agent, or Firm* — Ingrassia Fisher & Lorenz, P.C.

(57) ABSTRACT

A method of designing an optical photomask includes providing a target pattern, correcting the target pattern with an OPC model, adjusting the target pattern and/or the OPC model, and correcting a first corrected pattern. The target pattern indicates a target shape of a pre-pattern opening in a photoresist layer on a semiconductor substrate. Correcting the target pattern includes using an optical proximity correction (OPC) model to generate OPC output information that includes edge placement error (EPE) information, a first corrected pattern, and/or a simulated contour of the pre-pattern opening. Adjusting the target pattern and/or the OPC model includes adjusting with OPC based adjustments that are based on the OPC output information. Correcting the first corrected pattern includes using the OPC model in response to the OPC based adjustments to generate a second corrected pattern.

15 Claims, 3 Drawing Sheets

METHODS AND SYSTEMS FOR DESIGNING AND MANUFACTURING OPTICAL LITHOGRAPHY MASKS

TECHNICAL FIELD

Embodiments of the present disclosure are generally directed to methods and systems for designing and fabricating integrated circuits. More particularly, embodiments of the present disclosure are directed to methods and systems for optical proximity correction (OPC) in the design and fabrication of optical lithography masks.

BACKGROUND

Generally, integrated circuits and other semiconductor devices are used in a variety of electronic applications, such as computers, cellular phones, personal computing devices, and many other applications. Home, industrial, and automotive devices, which in the past included only mechanical components, now have electronic parts that require semiconductor devices.

Semiconductor devices are manufactured by depositing many different types of material layers over a semiconductor workpiece or wafer, and patterning the various material layers using lithography. The material layers typically include thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Lithography involves the transfer of an image of a mask to a material layer of a die or chip, also referred to as a wafer. The image is formed in a layer of photoresist, the photoresist is developed, and the photoresist is used as a mask during a process to alter the material layer, such as etching and patterning the material layer.

As feature sizes of semiconductor devices continue to decrease, as is the trend in the semiconductor industry, transferring patterns from a lithography mask to a material layer of a semiconductor device becomes more difficult, due to the effects of the light or energy used to expose the photoresist. A phenomenon referred to as the "proximity effect" results in the line width of patterns varying, depending on the proximity of a feature to other features. Closely-spaced features tend to be smaller than widely-spaced features, although on a lithography mask they include the same dimensions. It is important in many semiconductor device designs for features to have uniform, predictable dimensions across a surface of a wafer to achieve the required device performance.

To compensate for the proximity effect, optical proximity corrections (OPC) are often made to lithography masks, which may involve adjusting the widths or lengths of the lines on the mask. In a typical OPC run set development cycle, a model based OPC followed by an optical rules check (ORC) is performed to look for lithographic weakpoints. The ORC evaluates a full simulated contour of an opening formed in the photoresist layer when the photoresist is exposed using the lithography masks. The run set is then modified based on the errors found during the ORC run. Model based OPC and ORC are then performed using this updated target layer and the cycle is repeated until no ORC errors appear.

The OPC run set development cycle is time-consuming, and therefore costly. It is often desirable to introduce a product as quickly as possible to the market in the semiconductor device industry. However, it may take days or even weeks for the OPC run set development calculations to be performed on a semiconductor device design.

As such, it is desirable to provide faster and more efficient methods and systems of performing an OPC run set development cycle for lithography masks used to fabricate semiconductor devices. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Methods and computer systems for designing optical photomasks and manufacturing optical lithography masks are disclosed herein. In an exemplary embodiment, a method of designing an optical photomask includes providing a target pattern, correcting the target pattern with an OPC model, adjusting the target pattern and/or the OPC model, and correcting a first corrected pattern. The target pattern indicates a target shape of a pre-pattern opening in a photoresist layer on a semiconductor substrate. Correcting the target pattern includes using an optical proximity correction (OPC) model to generate OPC output information that includes edge placement error (EPE) information, a first corrected pattern, and/or a simulated contour of the pre-pattern opening. Adjusting the target pattern and/or the OPC model includes adjusting with OPC based adjustments that are based on the OPC output information. Correcting the first corrected pattern includes using the OPC model in response to the OPC based adjustments to generate a second corrected pattern.

In accordance with another exemplary embodiment, a method of manufacturing an optical lithography mask includes designing an optical photomask and manufacturing the optical photomask. Designing the optical photomask includes providing a target pattern, correcting the target pattern with an OPC model, adjusting the target pattern and/or the OPC model, and correcting a first corrected pattern. The target pattern indicates a target shape of a pre-pattern opening in a photoresist layer on a semiconductor substrate. Correcting the target pattern includes using an optical proximity correction (OPC) model to generate OPC output information that includes edge placement error (EPE) information, a first corrected pattern, and/or a simulated contour of the pre-pattern opening. Adjusting the target pattern and/or the OPC model includes adjusting with OPC based adjustments that are based on the OPC output information. Correcting the first corrected pattern includes using the OPC model in response to the OPC based adjustments to generate a second corrected pattern. Manufacturing the optical photomask includes manufacturing the optical photomask based on the second corrected pattern.

In accordance with another exemplary embodiment, a non-transitory computer readable medium storing control logic for operating a computer system includes control logic with control logic instructions. The control logic instructions are configured for providing a target pattern that indicates a target shape of a pre-pattern opening in a photoresist layer on a semiconductor substrate, correcting the target pattern using an optical proximity correction (OPC) model to generate OPC output information that includes edge placement error (EPE) information, a first corrected pattern, a simulated contour of the pre-pattern opening, or a combination thereof, adjusting the target pattern, the OPC model, or a combination thereof with OPC based adjustments that are based on the OPC output information, and correcting the first corrected pattern using the OPC model in response to the OPC based adjustments to generate a second corrected pattern.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Exemplary embodiments of the present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure provide methods for designing an optical photomask. Optical photomasks may be employed in the manufacture of integrated circuits in various steps that are well known in the art. Electromagnetic radiation is directed through or reflected off of the optical photomask and onto a photoresist layer that has been deposited overlying a semiconductor substrate. As used herein, the term "overlying" means "on," for example such that the photoresist layer is physically disposed directly on the semiconductor substrate, or "over," for example such that another material layer is interposed between the photoresist layer and the semiconductor substrate. The electromagnetic radiation, when contacting the photoresist layer, forms a pre-pattern opening in the photoresist layer. The pre-pattern opening allows for the deposition and/or etching of a plurality of materials overlying the semiconductor substrate to form one or more semiconductive transistor structures thereon.

Although the subject matter is described herein in the context of a complementary metal oxide semiconductor (CMOS) device, the subject matter is not intended to be limited to CMOS semiconductor devices, and may be utilized with other MOS semiconductor devices that are not CMOS semiconductor devices. Additionally, although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned overlying a semiconductor substrate.

Figure 1:
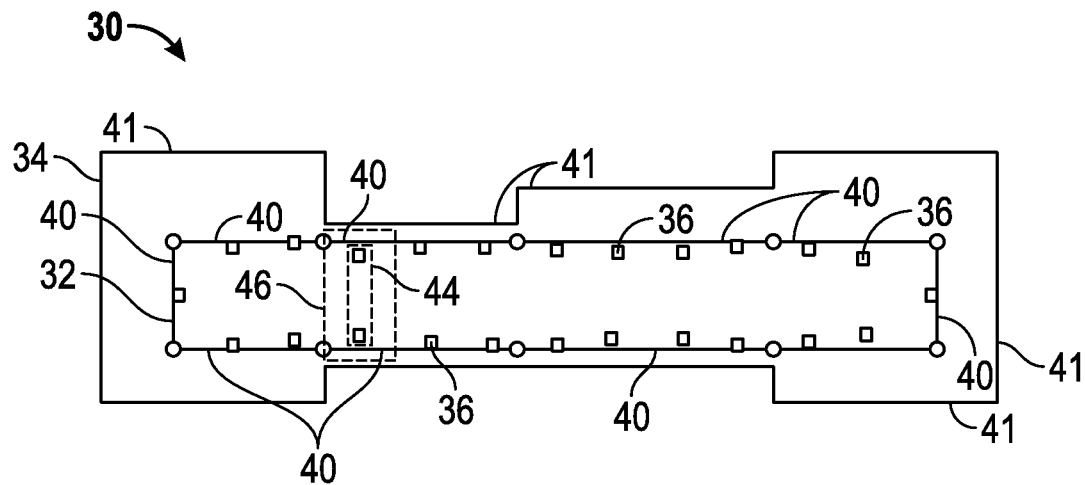
FIGS. 1 and 2 are simplified diagrams of optical lithography data in accordance with various embodiments.

Referring now to FIG. 1, optical lithography data are illustrated in a simplified diagram form and are indicated by reference numeral 30. The data 30 include a target pattern 32, a first corrected pattern 34, and a simulated contour 36 of a pre-pattern opening in a photoresist layer. The target pattern 32 is a plurality of polygons that indicate a target shape of the pre-pattern opening when the photoresist layer has been developed. The pre-pattern opening is formed by first exposing the photoresist layer to energy that is transmitted through or reflected off of the optical lithography mask onto the photoresist layer. The exposed photoresist layer is then developed to remove portions of the photoresist layer and create the pre-pattern opening. The pre-pattern opening may then be used, for example, to etch the portions of a wafer that are exposed through the pre-pattern opening.

The edges of the polygons in the target pattern 32 are separated into line segments or fragments 40 whose location may be adjusted by an optical proximity correction (OPC) model. As is currently known in the art, OPC models are applied to a desired semiconductor design to allow the proper pattern to be realized on the silicon wafer using photolithography. Generally, OPC models modify shapes in the target pattern to compensate for pattern distortion incurred by optical lithography or other wafer processes. The OPC model simulates contours of the actual shape of the pre-pattern opening based on known interactions between neighboring features and the lithographic process.

Each of the fragments 40 includes a simulation site at which an OPC model iteratively calculates a location of the respective fragment 40. During the iterations, the OPC model calculates points of the simulated contour 36 and determines an edge placement error (EPE) based on the differences between the target pattern 32 and the simulated contour 36. The OPC model moves or corrects the location of the respective fragment 40 during the iterations until the EPE is minimized. The corrected positions of the fragments 40 are represented by respective corrected fragments 41 on the first corrected pattern 34.

In the example provided, the simulated contour 36 indicates a "soft pinch" 44 pattern defect in which the points on the simulated contour 36 indicate that the printed pattern will have a width that is below design criteria. The soft pinch 44 is detected during a simulated contour coarse ORC operation, as will be described below with reference to FIG. 3. In some embodiments, a targeted area 46 that surrounds the soft pinch 44 is selected for further ORC operations, as will be described below with reference to FIG. 3.

Figure 2:
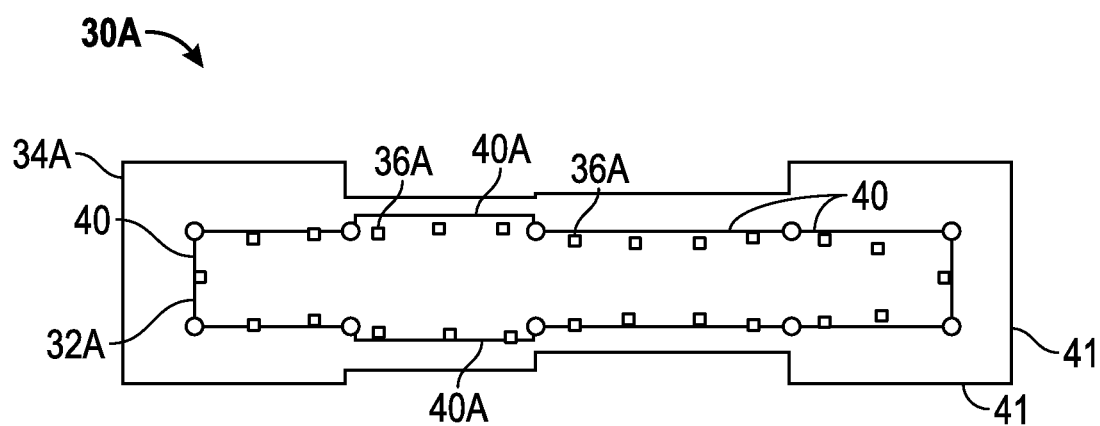

Referring now to FIG. 2, modified optical lithography data are illustrated in simplified diagram form and are indicated by reference numeral 30A. The data 30A are similar to the data 30, where like numerals refer to like components. The data 30A, however, include an updated target pattern 32A that has been modified based on the detected soft pinch 44. The updated target pattern 32A includes opposing fragments 40A that have been expanded away from each other when compared with the respective fragments 40 of the target pattern 32. When the OPC operations are performed on the updated target pattern 32A, a second corrected pattern 34A and an updated simulated contour 36A are generated. In the example provided, the OPC model is able to arrive at a solution that does not include the soft pinch 44.

Figure 3:
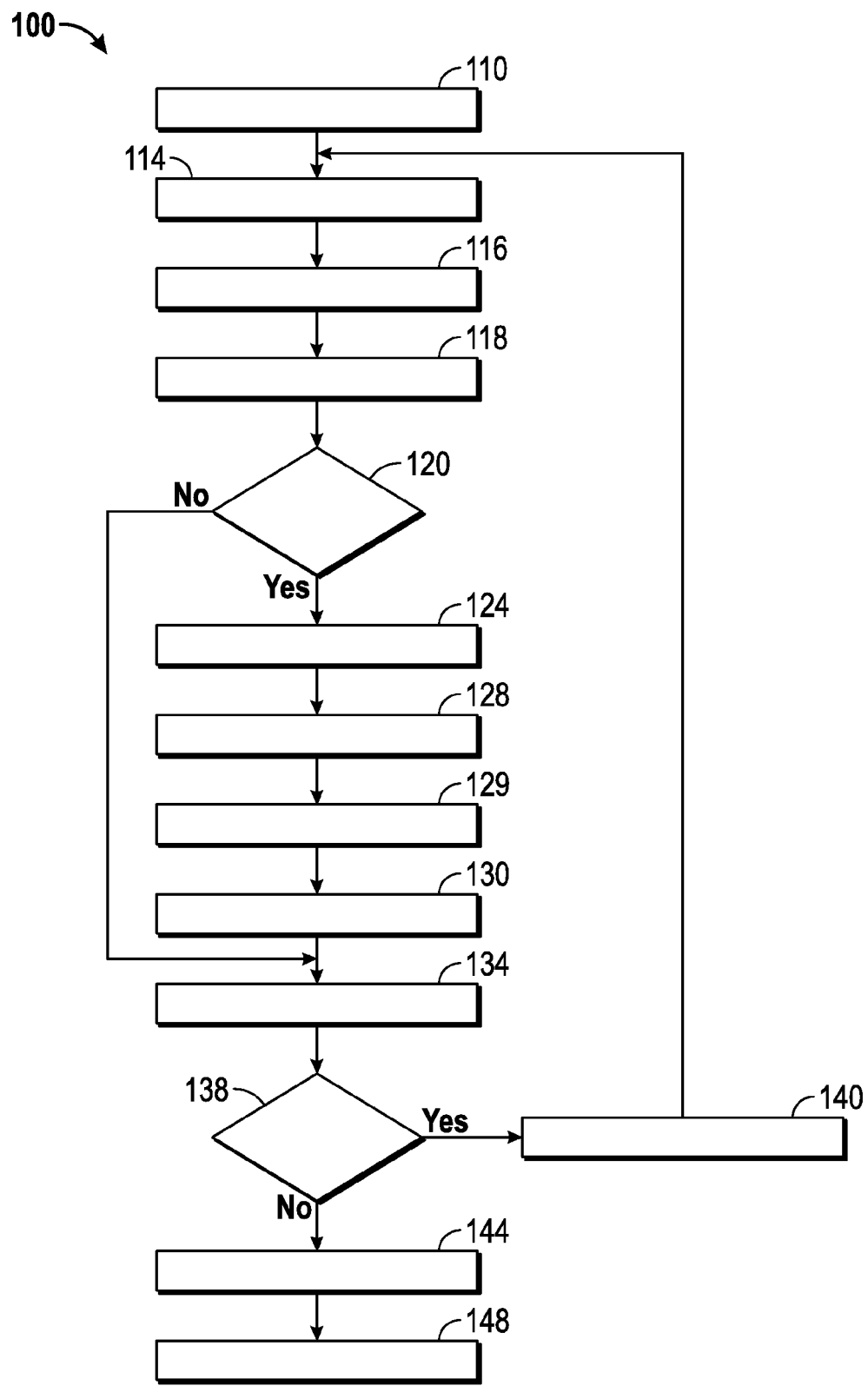
FIG. 3 is a flow diagram for a method of fabricating a semiconductor device in accordance with various embodiments.

Referring now to FIG. 3, a method 100 of fabricating a semiconductor device is illustrated in flow diagram form. In some embodiments, the data 30 and 30A of FIGS. 1 and 2 is used during the operations of the method 100. A target pattern is provided in operation 110. For example, the target pattern 32 may be provided and may correspond to a target shape and size of a pre-pattern opening in a photoresist layer. In some embodiments, the target pattern 32 is provided to a computer system (e.g., loaded into a memory of the computer system) on which operations of the method 100 will be executed.

The target pattern is corrected using an optical proximity correction (OPC) model in operation 114. The OPC model corrects the locations of the fragments by moving the fragment locations to achieve a simulated pre-pattern opening that approaches the shape of the target pattern. The OPC model iteratively calculates a suitable location for the edge of the polygon based on edge placement error (EPE) information. The EPE information is calculated based on the differences between the target pattern and the simulated contours of the pre-pattern opening. The OPC model generates OPC output information that includes the EPE information, a first corrected pattern, and the simulated contour of the pre-pattern opening. The first corrected pattern includes corrected locations of the fragments, and the simulated contour is calculated based on the first corrected pattern and/or the EPE information. For example, the OPC model may calculate the simulated contour 36 based on the first corrected pattern 34.

At operation 116, a coarse optical rule check (ORC) is performed based on the simulated contour and/or the EPE information of the OPC output information. In general, an ORC is a post-OPC simulation that verifies the OPC information and determines whether the simulated contour indicates hotspots/lithographic weakpoints that violate design criteria, as is known in the art. The design criteria may be based on preventing undesirable pattern outcomes, such as line end pullback, necking, gate length variation, loss of pattern fidelity, pinching, etc.

The ORC of operation 116 is a coarse ORC because coarse ORC performs calculations on many fewer data points than are used in a typical, full ORC. For example, the simulated contour 36 of the data 30 does not include as many data points as are used in a typical, full ORC. Therefore, the simulation time of the coarse ORC is faster than a full ORC, and may be used to provide early feedback to a user or to a computer simulation before or during a full ORC. The data points used for the coarse ORC may be selected based on the discrete simulation contour locations of the OPC output information or based on mathematically interpolated contours generated from the discrete simulation contour locations. The coarse ORC detects portions of the simulated contour that do not meet design criteria. For example, the simulated contour 36 exhibits the soft pinch 44 that may be detected by the coarse ORC of operation 116.

An alert is generated in response to a design criteria violation determined based on the OPC output information at operation 118. The alert includes an alert location at which design criteria are not met. In some embodiments, a tag is applied to the mask fragments which correspond to the alert locations. In some embodiments, the tag is further or alternatively applied to the segment on the target pattern corresponding to the tagged mask fragment. For example, the location of the soft pinch 44 may be included in the alert as the alert location and the corresponding fragments 40 may be tagged.

In some embodiments, the alert is generated when the EPE information indicates that an EPE is above a threshold at an alert location in operation 118. The EPE may be above the threshold when the OPC model is not able to move the fragment to a location that results in a simulated contour that is within a specified distance from the target pattern. For example, the OPC model may include design criteria that indicate the specified distance between the target pattern 32 and the simulated contour 36, beyond which an alert is to be generated.

In some embodiments, the alert is generated when the coarse ORC detects that the simulated contour is not within specified design limits. For example, the alert may be generated in response to the coarse ORC detecting the soft pinch 44 based on the simulated contour 36. In some embodiments, the alert halts the simulation until an operator reviews the alert. In some embodiments, the alert triggers additional simulation operations, as will be described below.

In operation 120, the method 100 determines whether an alert was generated in operation 118. When an alert is generated, a targeted ORC is performed in a targeted area surrounding the alert location in operation 124. The density of data points used in the targeted ORC is similar to a typical, full ORC, but the targeted ORC is performed only on an area that surrounds the alert location. Because the fragments have already been corrected by the OPC, the ORC does not need to iteratively calculate movement of the fragments, and more sites may be selected while maintaining target simulation times. Additionally, because only a targeted area is selected, computation time is reduced relative to a full ORC and early feedback may be provided to a user or simulation software regarding errors in the target pattern, the first corrected pattern, or the OPC model.

The targeted area around the alert location may be selected to provide further data that may increase the chances of an effective adjustment of the first corrected pattern that will eliminate the alert. The size of the targeted area may be selected based on computational capacity, desired run time of the ORC, the presence of adjacent features, the feature type, or any other suitable criteria for selection of the targeted area.

In one example, the targeted area may be selected based on a value of the EPE information exceeding a threshold. In another example, the targeted area 46 may be selected based on the coarse ORC, which is based on the OPC output information. In some embodiments, the targeted area may include the fragment that includes the alert location as well as the two fragments that are adjacent to the fragment with the alert location. The simulated contour is calculated at additional data points along the three fragments to generate the additional information and design criteria violations. It should be appreciated that any suitable ORC models or calculation methods may be used for the simulations at the targeted area.

The target pattern and/or the OPC model are adjusted in operation 128 in response to the alert and based on the OPC output information. For example, the fragments 40 of the target pattern 32 may be bias adjusted to the adjusted fragments 40A of the modified target pattern 32A. In some embodiments, the adjustments of operation 128 include changing parameters of the OPC model, such as a feedback factor, mask error factor, etc. By basing the adjustments on the OPC output information, the adjustments of operation 128 may be made before the full run ORC. As described above, an ORC on an entire pattern is computationally intensive, and therefore requires significant computation time. Accordingly, the adjustments based on the OPC output information permit correction of errors with fewer full ORC cycles.

In some embodiments, relaxed criteria for use by the OPC model are generated in operation 129. The relaxed criteria are based on the adjustments of operation 128. For example, an engineer or user of the OPC model may create the relaxed criteria for use by the OPC model when the engineer or user notices that similar updates have been made multiple times in operation 128. Accordingly, the relaxed criteria may permit the OPC model to perform the adjustments in response to the alert when the OPC model is not able to meet the design criteria. The OPC model may use the relaxed criteria to move the fragments in a manner different from the movement during operation 114.

The OPC model is used in operation 130 to perform a targeted OPC at the alert locations in response to the adjustments of operation 128. The targeted OPC re-calculates the OPC output information at the alert locations to generate a second corrected pattern. In some embodiments, the second corrected pattern is the same as the first corrected pattern for portions of the first corrected pattern that do not correspond with the alert location. For example, the second pattern 34A may be substantially similar to the first corrected pattern 34 in locations other than the fragments 40A. By limiting operation 130 to the alert locations, the targeted OPC may be completed much faster than the original OPC of the full target pattern as performed in operation 114.

At operation 134 a full ORC is performed on the second corrected pattern. The full ORC is "full" because it includes more data points than are used in both the coarse ORC and the targeted ORC. The full ORC performs simulations on a large number of data points across a pattern, as is known in the art. As described above, the ORC detects design criteria violations. Using the large number of data points results in a computation time that may be a full day or more. By providing early feedback of violations in operation 118, the violations may be corrected earlier in the OPC/ORC cycle. Accordingly, the full ORC of operation 134 is more likely to be free of design criteria violations. Therefore, operations 110, 114, 118, 120, 124, 128, 129, 130, and 134 describe a beneficial method of designing an optical photomask for forming a pre-pattern opening in a photoresist layer.

When design criteria violations are detected during the ORC of operation 134, adjustments to the target pattern, the OPC model, or a combination thereof may be made in operation 140. As discussed above, by making adjustments in operation 128 based on the OPC output, the violations detected in operation 138 may be reduced. Accordingly, the number of OPC/ORC cycles may be reduced, and the optical lithography mask may be designed in a shorter period of time.

An optical lithography mask that includes the second corrected pattern is manufactured in operation 144. The optical lithography mask is used to fabricate a semiconductor device in operation 148. Manufacture of the optical lithography mask and fabrication of the semiconductor device may be accomplished by use of known techniques.

Figure 4:
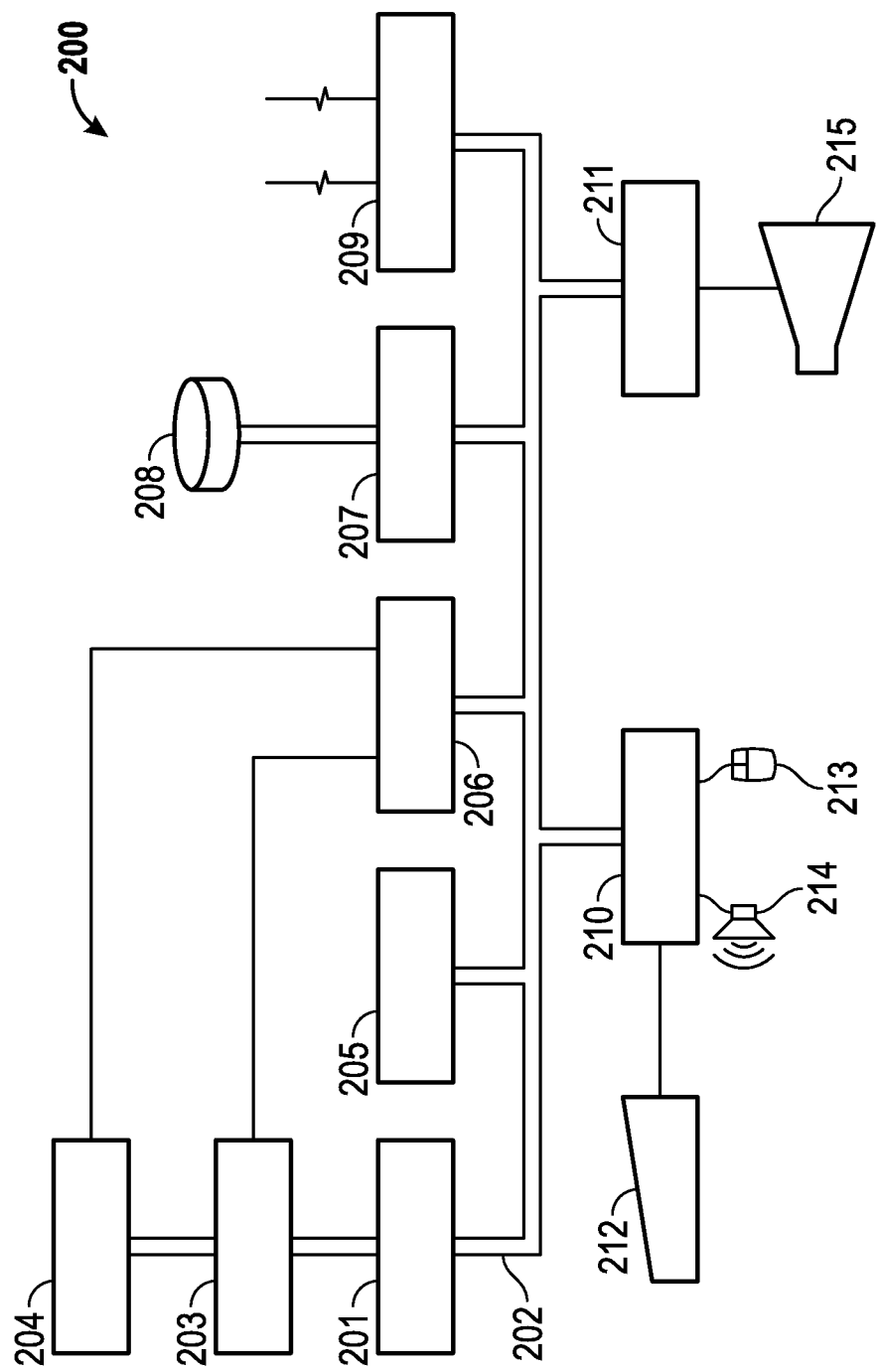
FIG. 4 is a block diagram of a computing system in accordance with various embodiments.

Advantageously, embodiments of the present disclosure can be implemented on one or more computer systems. For example, the OPC model computations of the method 100 may be performed using one or more computer systems. FIG. 4 is a schematic illustration of a block diagram of a computing system 200 arranged in accordance with some examples. Computer system 200 is also representative of a hardware environment for the present disclosure. For example, computer system 200 may have a processor 201 coupled to various other components by a system bus 202.

With further reference to FIG. 4, an operating system 203 may run on processor 201, and provide control and coordinate the functions of the various components. An application 204 in accordance with the principles of examples of the present disclosure may execute in conjunction with operating system 203, and provide calls and/or instructions to operating system 203 where the calls/instructions implement the various functions or services to be performed by application 204.

A read-only memory ("ROM") 205 may be coupled to system bus 202, and may include a basic input/output system ("BIOS") that can control certain basic functions of computer device 200. A random access memory ("RAM") 206 and a disk adapter 207 may also be coupled to system bus 202. Such memory components may be used to store, for example, the OPC model parameters or application 204 software code. It should be noted that software components, including operating system 203 and application 204, may be loaded into RAM 206, which may be computer system's main memory for execution. A disk adapter 207 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 208, e.g., disk drive.

Computer system 200 may further include a communications adapter 209 coupled to bus 202. Communications adapter 209 may interconnect bus 202 with an external network (not shown) thereby facilitating computer system 200 to communicate with other similar and/or different devices.

Input/Output ("I/O") devices may also be connected to computer system 200 via a user interface adapter 210 and a display adapter 211. For example, a keyboard 212, a mouse 213 and a speaker 214 may be interconnected to bus 202 through user interface adapter 210. Data may be provided to computer system 200 through any of these example devices. A display monitor 215 may be connected to system bus 202 by display adapter 211. In this example manner, a user can provide data or other information to computer system 200 through keyboard 212 and/or mouse 213, and obtain output from computer system 200 via display 215 and/or speaker 214.

The operations illustrated in FIG. 3 may be governed by instructions that are stored in a non-transitory computer readable storage medium and that are executed by at least one processor of the computer system 200. Each of the operations shown in FIG. 3 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The methods and systems disclosed herein exhibit several beneficial attributes. For example, a method is disclosed that includes optical proximity correction that may reduce the hotspots/lithographic weakpoints (design criteria violations) found during the full post OPC Optical Rule Checking. The method incorporates a hybrid OPC flow that includes simultaneous model based target layer changes and model based optical proximity correction steps. The method further utilizes the simulated pre-pattern opening contour shape that is obtained after a certain number of OPC iterations.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of designing an optical photomask, the method comprising:

providing, to a computer device, a target pattern that indicates a target shape of a pre-pattern opening in a photoresist layer on a semiconductor substrate;
correcting, with the computer device, the target pattern using an optical proximity correction (OPC) model to generate OPC output information that includes edge placement error (EPE) information, a first corrected pattern, a simulated contour of the pre-pattern opening, or a combination thereof;
generating an alert in response to the OPC output information indicating a design criteria violation at an alert location and based on a coarse optical rule check (ORC), the EPE information exceeding a threshold, or a combination thereof;
performing a targeted ORC in a targeted area surrounding the alert location in response to the alert;
adjusting, with the computer device, the target pattern, the OPC model, or a combination thereof with OPC based adjustments that are based on the OPC output information; and
correcting, with the computer device, the first corrected pattern using the OPC model in response to the OPC based adjustments to generate a second corrected pattern.

2. The method of claim 1, further comprising performing the coarse optical rule check (ORC) based on the OPC output information.

3. The method of claim 1, wherein generating the alert further includes generating the alert in response to the EPE information indicating an EPE above a threshold at the alert location.

4. The method of claim 1, further comprising generating relaxed criteria for use by the OPC model in response to the alert.

5. The method of claim 1, wherein correcting the first corrected pattern further includes performing a targeted OPC at the alert location based on the OPC based adjustments.

6. The method of claim 5, further comprising performing a full ORC on the second corrected pattern.

7. A method of manufacturing an optical lithography mask, the method comprising:
designing an optical photomask, wherein designing comprises:
providing, to a computer device, a target pattern that indicates a target shape of a pre-pattern opening in a photoresist layer on a semiconductor substrate;
correcting, with the computer device, the target pattern using an optical proximity correction (OPC) model to generate OPC output information that includes edge placement error (EPE) information, a first corrected pattern, a simulated contour of the pre-pattern opening, or a combination thereof;
generating an alert in response to the OPC output information indicating a design criteria violation at an alert location and based on a course optical rule check (ORC), the EPE information exceeding a threshold, or a combination thereof
performing a targeted ORC in a targeted area surrounding the alert location in response to the alert;
adjusting, with the computer device, the target pattern, the OPC model, or a combination thereof with OPC based adjustments that are based on the OPC output information; and
correcting, with the computer device, the first corrected pattern using the OPC model in response to the OPC based adjustments to generate a second corrected pattern; and
manufacturing the optical photomask based on the second corrected pattern.

8. The method of claim 7, wherein correcting the first corrected pattern further includes performing a targeted OPC at the alert location based on the OPC based adjustments.

9. A non-transitory computer readable medium storing control logic for operating a computer system, the control logic including control logic instructions for:
providing a target pattern that indicates a target shape of a pre-pattern opening in a photoresist layer on a semiconductor substrate;
correcting the target pattern using an optical proximity correction (OPC) model to generate OPC output information that includes edge placement error (EPE) information, a first corrected pattern, a simulated contour of the pre-pattern opening, or a combination thereof;
generating an alert in response to the OPC output information indicating a design criteria violation at an alert location and based on a coarse optical rule check (ORC), the EPE information exceeding a threshold, or a combination thereof;
performing a targeted ORC in a targeted area surrounding the alert location in response to the alert;
adjusting the target pattern, the OPC model, or a combination thereof with OPC based adjustments that are based on the OPC output information; and
correcting the first corrected pattern using the OPC model in response to the OPC based adjustments to generate a second corrected pattern.

10. The non-transitory computer readable medium of claim 9, wherein the control logic is configured for performing the coarse optical rule check (ORC) based on the OPC output information.

11. The non-transitory computer readable medium of claim 9, wherein generating the alert includes generating the alert in response to the EPE information exceeding a threshold at the alert location.

12. The non-transitory computer readable medium of claim 9, wherein the control logic is further configured for outputting data associated with the alert for review by a user.

13. The non-transitory computer readable medium of claim 9, wherein the control logic is further configured for updating the target pattern, updated parameters of the OPC model, or combinations thereof at the alert location in response to the alert and prior to completion of correcting the target pattern using the OPC model.

14. The non-transitory computer readable medium of claim 13, wherein the control logic is further configured for performing a targeted OPC at the alert location based on the updated target layer, updated parameters of the OPC model, or combinations thereof prior to the full ORC.

15. The non-transitory computer readable medium of claim 9, wherein the control logic is further configured for updating the target pattern, the parameters of the OPC model, or combinations thereof based on relaxed criteria in response to the alert.

* * * * *